(12) United States Patent
Chang

(10) Patent No.: US 8,373,988 B2
(45) Date of Patent: Feb. 12, 2013

(54) SERVER CABINET AND SERVER SYSTEM USING THE SAME

(75) Inventor: Yao-Ting Chang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 270 days.

(21) Appl. No.: 12/979,376

(22) Filed: Dec. 28, 2010

(65) Prior Publication Data

US 2012/0134110 A1 May 31, 2012

(51) Int. Cl.
*H05K 7/20* (2006.01)
(52) U.S. Cl. ......... 361/695; 361/690; 361/692; 454/184
(58) Field of Classification Search ............... None
See application file for complete search history.

(56) References Cited

U.S. PATENT DOCUMENTS

| | | | | |
|---|---|---|---|---|
| 5,957,556 | A * | 9/1999 | Singer et al. | 312/223.6 |
| 7,160,113 | B2 * | 1/2007 | McConnell et al. | 434/365 |
| 7,660,116 | B2 * | 2/2010 | Claassen et al. | 361/696 |
| 2009/0126914 | A1 * | 5/2009 | Dunn | 165/121 |

* cited by examiner

*Primary Examiner* — Boris Chervinsky
(74) *Attorney, Agent, or Firm* — Altis Law Group, Inc.

(57) ABSTRACT

A server cabinet adapted for receiving servers therein includes a top plate and a bottom plate opposite to the top plate, a left side plate and a right side plate connecting with the top and bottom plates respectively, and a curtain assembly disposed at a front side of the server cabinet. The curtain assembly includes a pivot and a curtain coiled on the pivot. The curtain assembly defines through holes therein. The curtain is capable of spreading out from the pivot toward the bottom plate to thereby cover the front side of the server cabinet.

20 Claims, 5 Drawing Sheets

SERVER CABINET AND SERVER SYSTEM USING THE SAME

CROSS REFERENCE TO RELATED APPLICATIONS

This application is related to two co-pending applications entitled "SERVER CABINET FOR SERVER SYSTEM" U.S. patent application Ser. No. 12/980,281 and "SERVER CABINET AND SERVER SYSTEM UTILIZING THE SAME" U.S. patent application Ser. No. 12/981,568, assigned to the same assignee of this application and filed on the same date as this application. The two related applications are incorporated herein by reference.

BACKGROUND

1. Technical Field

The disclosure relates to server cabinets for use in server systems, and more particularly to a server cabinet facilitating heat dissipation.

2. Description of Related Art

Nowadays, numerous server systems are used for data storage and data operation. A server system generally includes a server cabinet, and a number of standard servers stacked in the server cabinet one on another along a height direction of the server cabinet. The servers generate considerable heat during operation, and the servers may suffer damage if the heat is not efficiently removed.

What is needed, therefore, is a server cabinet for use in a server system which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
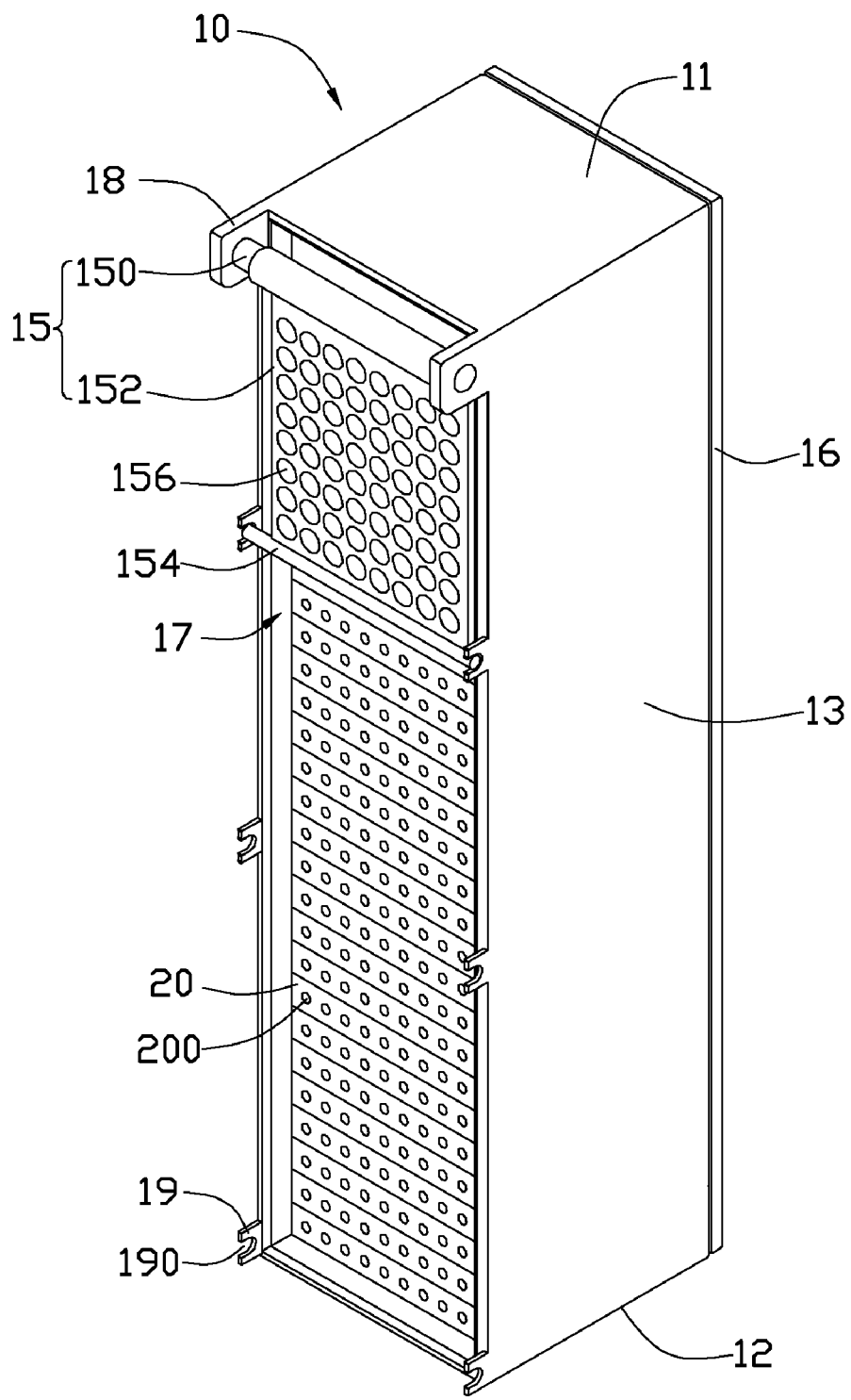
FIG. 1 is an isometric, assembled view of a server cabinet of a server system in accordance with an embodiment of the disclosure.
Figure 5:
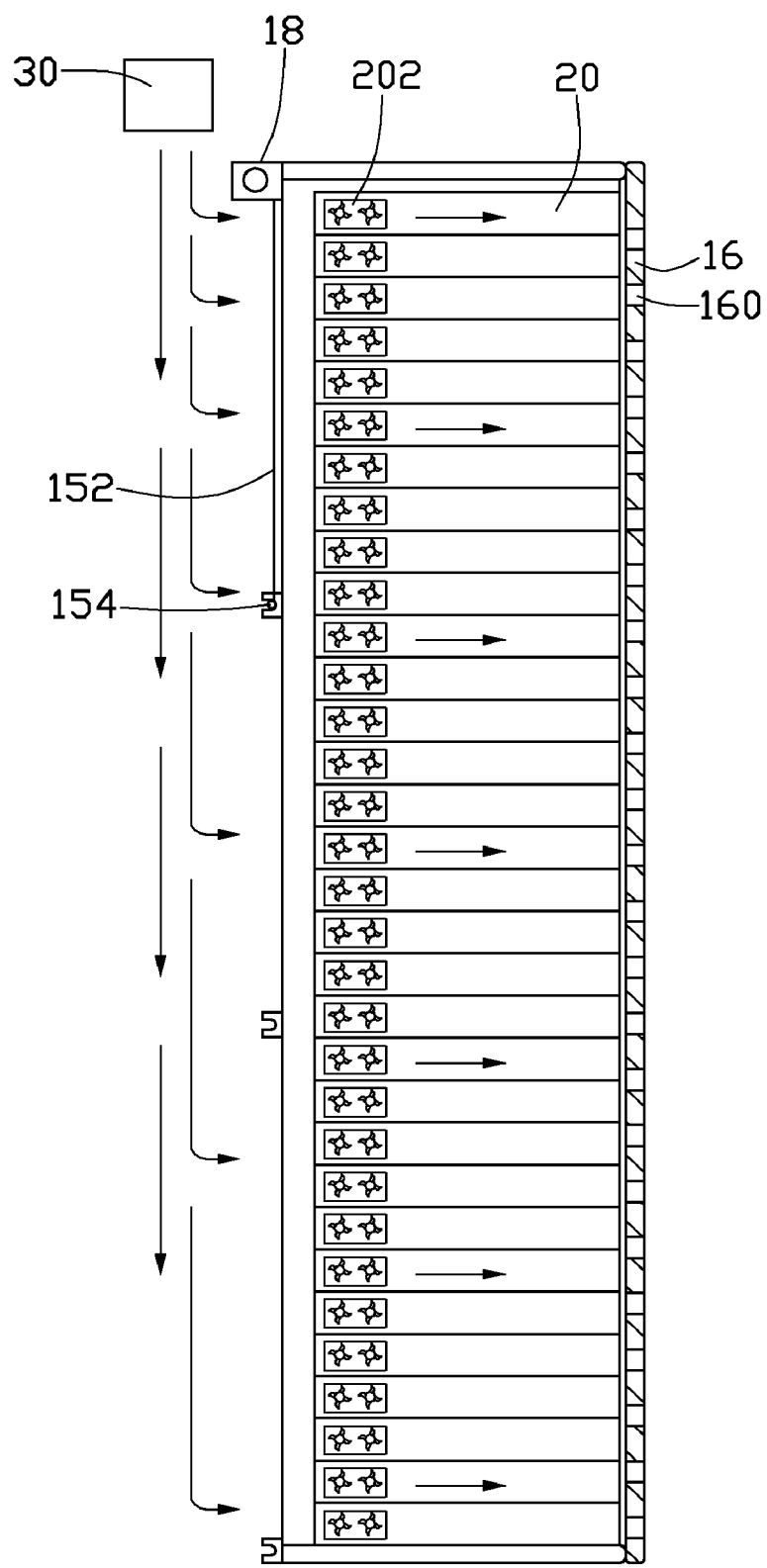
FIG. 5 is a cross sectional view of the server cabinet of FIG. 1, and showing an airflow generating device of the server system disposed at a top of the server cabinet.

Referring to FIGS. 1 and 5, a server system in accordance with an embodiment of the disclosure is shown. The server system includes a server cabinet 10, a plurality of standard servers 20 stacked in the server cabinet 10, and an airflow generating device 30 disposed near a top end of the server cabinet 10. The airflow generating device 30 is for generating airflow, and can be an air conditioner or a blower. The server system can be applied to a Container Data Center. The Container Data Center is a data center which is formed by mounting a plurality of server systems in a standard container.

The server cabinet 10 is substantially cuboid, and includes a top plate 11, a bottom plate 12 opposite to and parallel to the top plate 11, left and right side plates 13 connecting left and right edges of the top and bottom plates 11, 12 respectively, a curtain assembly 15 disposed at a front side of the top plate 11, and a rear side plate 16 disposed at rear sides of the top and bottom plates 11, 12. The top and bottom plates 11, 12, the left and right side plates 13, and the rear side plate 16 cooperatively form a receiving space 17.

Figure 2:
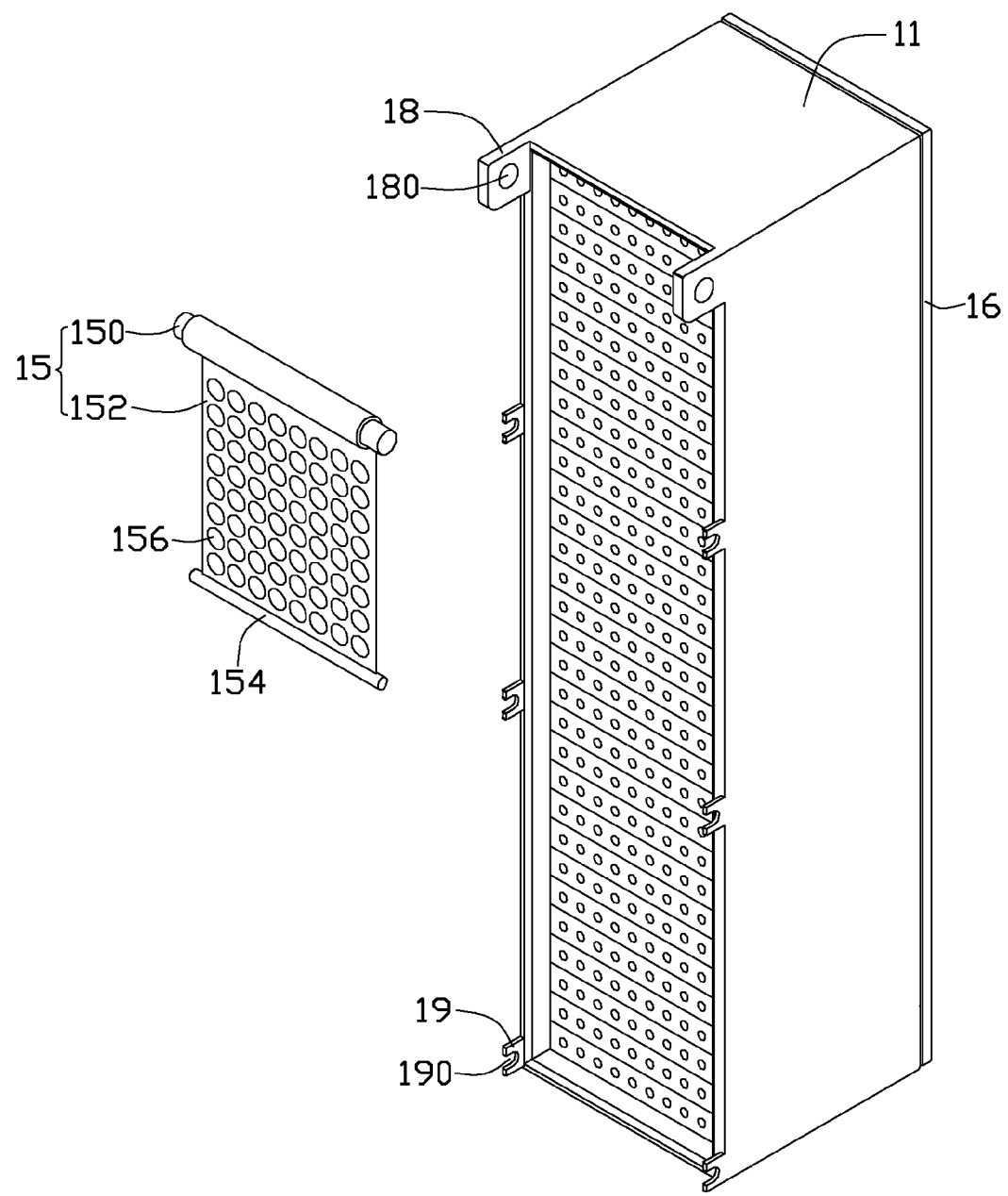
FIG. 2 is a partially exploded view of the server cabinet of FIG. 1.

Also referring to FIG. 2, a supporting portion (or knuckle) 18 extends outwardly from a top edge of a front side of each of the left and right side plates 13. Each supporting portion 18 defines a circular pivot hole 180 in a center thereof. Three fixing portions 19 extend outwardly from the front side of each of the left and right side plates 13. The three fixing portions 19 of each of the left and right side plates 13 are arranged along a length of the front side of the respective left or right side plate 13, below the corresponding supporting portion 18. The three fixing portions 19 of each of the left and right side plates 13 are spaced apart from each other, and from the supporting portion 18, by suitable intervals. Each fixing portion 19 of the left side plate 13 is aligned with to a corresponding one of the fixing portions 19 of the right side plate 13 along a horizontal direction, to thereby form one pair of fixing portions 19. Each fixing portion 19 defines a cutout 190 in a distal end thereof.

The curtain assembly 15 is disposed essentially between the two supporting portions 18, and includes a curtain 152, a pivot 150 connected to a top end of the curtain 152, and a rod 154 connected to a bottom end of the curtain 152. Two ends of the pivot 150 respectively extend through the pivot holes 180 of the supporting portions 18, and the pivot 150 can rotate in the supporting portions 18. When the pivot 150 rotates in the supporting portions 18, the curtain 152 can be unrolled from or rolled up on the pivot 150. When the rod 154 is pulled to move downwardly, the pivot 150 is forced to rotate and the curtain 152 unroll from the pivot 150 downwardly. During this movement, an area of the curtain 152 covering the front side of the server cabinet 10 is gradually increased. Two ends of the rod 154 can be received in the cutouts 190 of one pair of fixing portions 19. Contrarily, when the pivot 150 rotates reversely, the rod 154 moves upwardly toward the pivot 150, and the area of the curtain 152 covering the front side of the server cabinet 10 is gradually decreased. In the present embodiment, the curtain assembly 15 is spring-loaded so that the pivot 150 can be conveniently reversely rotated when needed.

Figure 3:
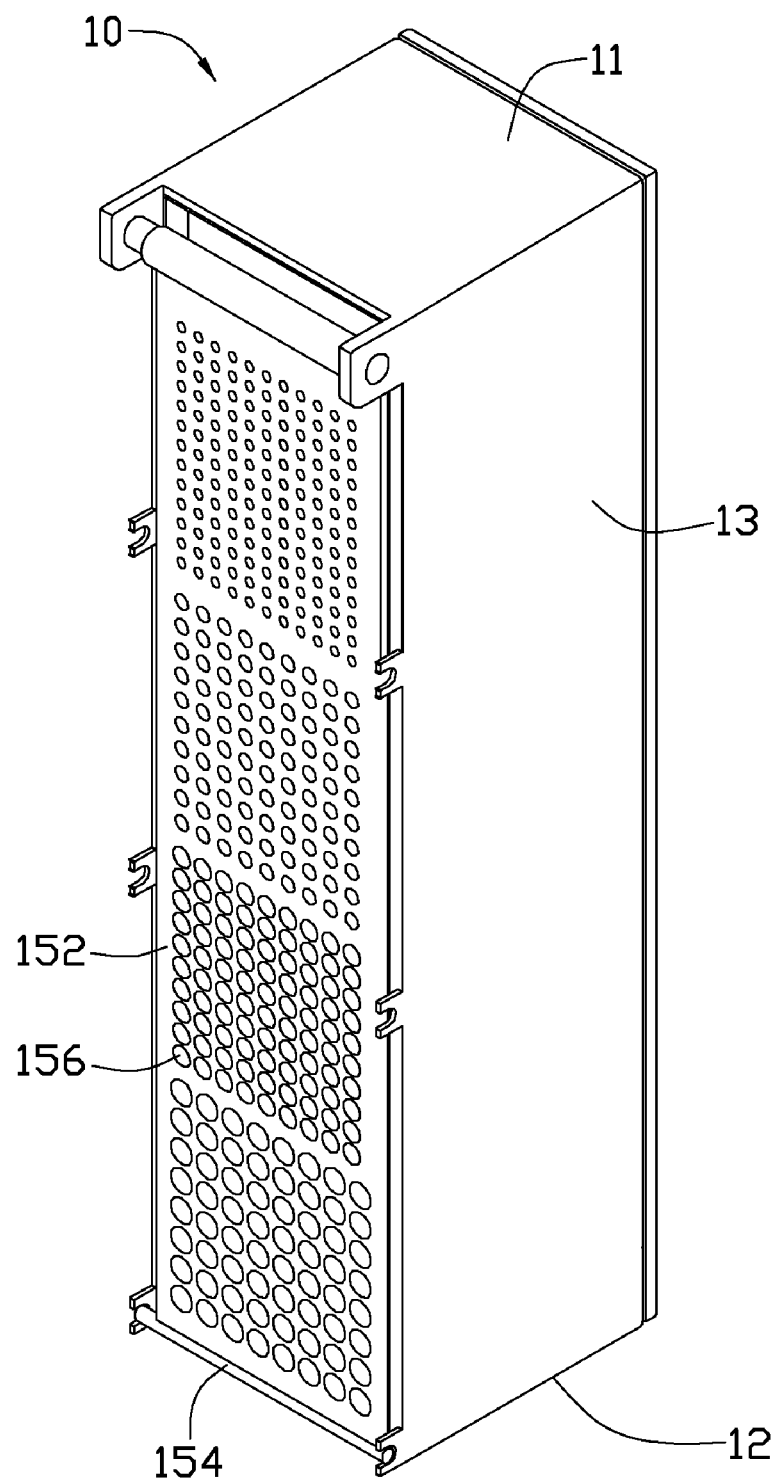
FIG. 3 is similar to FIG. 1, but showing a curtain of the server cabinet fully extended down.

Referring to FIG. 3, the curtain 152 is a rectangular thin sheet, and can be made of cloth, paper or metal foil. The curtain 152 defines a plurality of through holes 156. The through holes 156 are arranged in four matrixes along a height direction of the curtain 152. The through holes 156 in each matrix have the same diameter, and the through holes 156 in any two given matrixes have different diameters. When the curtain 152 is fully extended, a total area of the through holes 156 in an upper half portion of the curtain 152 adjacent to the top plate 11 is different from a total area of the through holes 156 in a lower half portion of the curtain 152 adjacent to the bottom plate 12. In this embodiment, with the airflow generating device 30 adjacent to the top end of the front side plate 14, the diameters of the through holes 156 of the four matrixes gradually increase from the top portion of the curtain 152 to the bottom portion of the curtain 152. The diameter of the through holes 156 of the topmost matrix is smaller than that of the through holes 156 of the bottommost matrix. A total area of the through holes 156 in an upper half portion of the curtain 152 is smaller than a total area of the through holes 156 in a lower half portion of the curtain 152.

Figure 4:
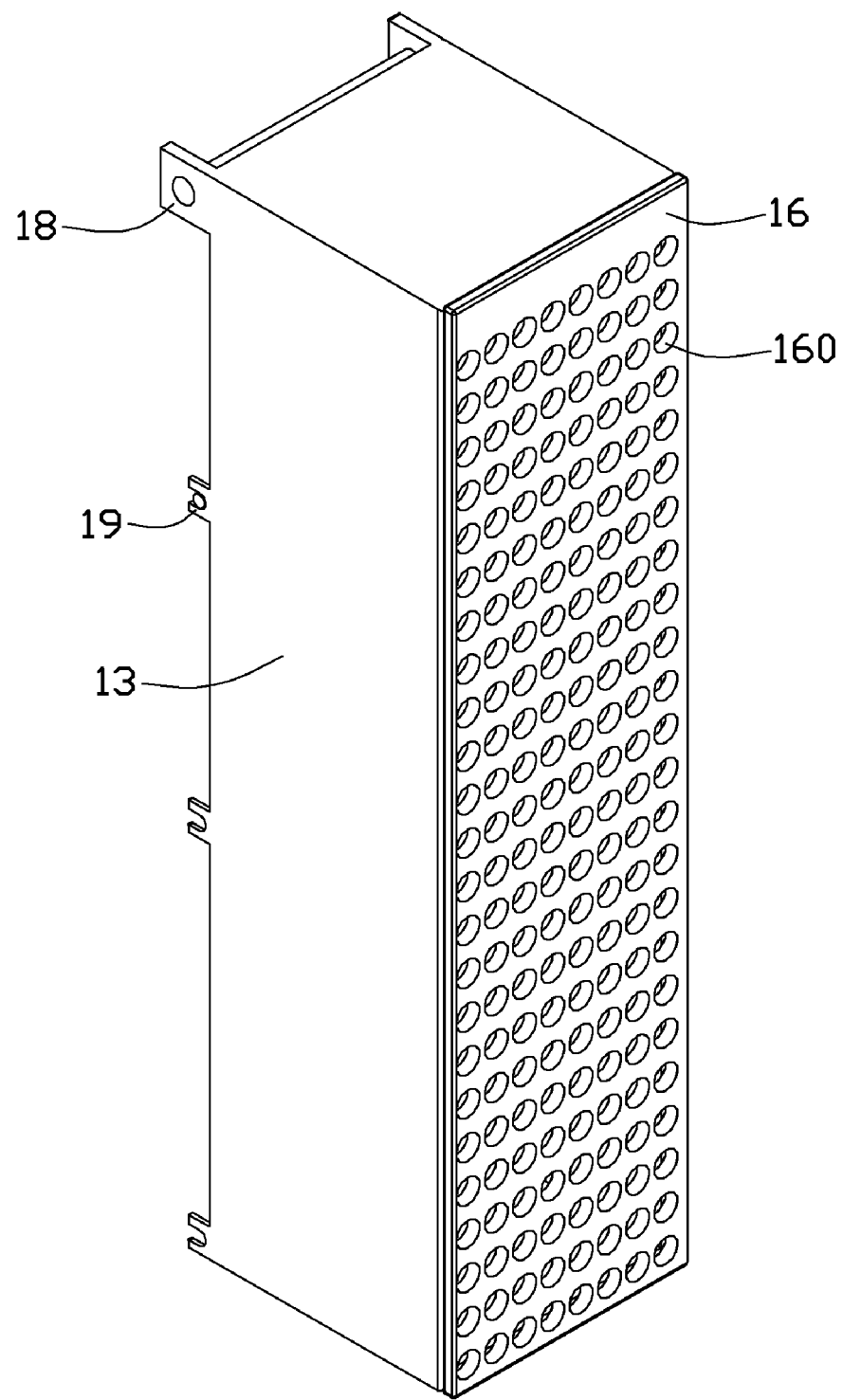
FIG. 4 is an isometric view of the server system of FIG. 1, seen from another aspect.

Also referring to FIG. 4, the rear side plate 16 pivotedly connects one of the left and right side plates 13. The rear side plate 16 defines a plurality of through holes 160 arranged in a matrix. The through holes 160 have the same diameter.

Also referring to FIG. 5, the servers 20 are received in the receiving space 17 of the server cabinet 10 and stacked one on another. Each server 20 defines a plurality of through holes 200, corresponding to the through holes 156 of the curtain 152 and the through holes 160 of the rear side plate 16. A plurality of fans 202 for generating intake airflow are disposed in each server 20.

In use, the airflow generating device 30 is disposed adjacent to the top of the curtain assembly 15. Cold (or cooler) airflow generated by the airflow generating device 30 blows from the top of the server cabinet 10 to the bottom of the server cabinet 10. The air flows into the front side of the server cabinet 10. The fans 202 suck the airflow through the through holes 200 and then exhaust hot airflow out of the servers 20, to thereby dissipate heat from the servers 20. The hot air outside the servers 20 then flows out from the server cabinet 10 via the through holes 160 of the rear side plate 16. Since the airflow generating device 30 is disposed near the top of the server cabinet 10, much more airflow can ordinarily directly blow to the top portion of the server cabinet 10.

As seen in FIG. 5, when the two ends of the rod 154 are received in the cutouts 190 of the topmost pair of fixing portions 19 adjacent to the top portion of the server cabinet 10, the curtain 152 only covers an upper portion of the front side of the server cabinet 10, and the remaining portion of the front side of the server cabinet 10 below the rod 154 is not covered by the curtain 152. At the upper portion of the front side of the server cabinet 10, the airflow can only enter the corresponding upper portion of the server cabinet 10 via the through holes 156 of the curtain 152. Therefore a portion of such airflow is blocked by the curtain 152 at the upper portion of the front side of the server cabinet 10, and flows toward the remaining portion of the front side of the server cabinet 10. As a result, the amount of air flowing into the upper portion of the server cabinet 10 adjacent to the airflow generating device 30 is attenuated by the curtain 152, and the amount of air flowing toward the remaining portion of the server cabinet 10 farther away from the airflow generating device 30 is amplified. Thus, the airflow generated by the airflow generating device 30 can flow toward the servers 20 in the server cabinet 10 more evenly. In particular, the servers 20 away from the airflow generating device 30 can receive more airflow than would otherwise be the case. This improves a heat dissipation efficiency of the server system.

As seen in FIG. 3, when the two ends of the rod 154 are received in the cutouts 190 of the bottommost pair of fixing portions 19 at the front side of the bottom plate 12, the curtain 152 is completely unrolled from the pivot 150, and the curtain 152 completely covers the front side of the server cabinet 10. Since diameters of the through holes 156 of the four matrixes gradually increase from the top portion of the curtain 152 adjacent to the airflow generating device 30 to the bottom portion of the curtain 152 farthest away from the airflow generating device 30, and since the total area of the through holes 156 in the upper half portion of the curtain 152 adjacent to the airflow generating device 30 is less than the total area of the through holes 156 in the lower half portion of the curtain 152 away from the airflow generating device 30, a portion of the airflow generated by the airflow generating device 30 and flowing through the through holes 156 in the top portion of the curtain 152 is attenuated, and a portion of the airflow generated by the airflow generating device 30 and flowing through the through holes 156 in the bottom portion of the curtain 152 is amplified. Thus, the airflow generated by the airflow generating device 30 can flow toward the servers 20 in the server cabinet 10 more evenly. In particular, the servers 20 away from the airflow generating device 30 can receive more airflow than would otherwise be the case. This improves the heat dissipation efficiency of the server system.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A server cabinet adapted for receiving a plurality of servers therein, the server cabinet comprising:
   a top plate and a bottom plate parallel to the top plate;
   a left side plate and a right side plate connecting with the top and bottom plates respectively; and
   a curtain assembly disposed at a top of a front side of the server cabinet, the curtain assembly comprising a pivot and a curtain connected to the pivot, the curtain defining a plurality of through holes therein, the curtain being capable of unrolling out from around the pivot toward the bottom plate to thereby selectively partially or completely cover the front side of the server cabinet.

2. The server cabinet of claim 1, wherein a supporting portion extends from each of top ends of the left and right side plates, each supporting portion defining a circular pivot hole therein, two ends of the pivot respectively extending through the pivot holes of the supporting portions, the pivot being rotatable relative to the supporting portions, an area of the curtain covering the front side of the server cabinet being adjusted by rotating the pivot.

3. The server cabinet of claim 1, wherein the curtain assembly further comprises a rod connected to a bottom end of the curtain.

4. The server cabinet of claim 3, wherein one pair of opposite fixing portions extend from the front sides of the left and right side plates, each fixing portion defining a cutout therein, two ends of the rod being received in the cutouts of the fixing portions.

5. The server cabinet of claim 1, wherein the through holes are arranged in a plurality of matrixes along a height direction of the front side plate, the through holes in each matrix having the same diameter, the through holes in different matrixes having different sizes of diameters.

6. The server cabinet of claim 5, wherein the diameter of each through hole in an upper half portion of the curtain adjacent to the top plate is smaller than the diameter of each through hole in a lower half portion of the curtain adjacent to the bottom plate.

7. The server cabinet of claim 5, wherein the diameters of the through holes gradually increase from the upper half portion of the curtain adjacent to the top plate to the lower half portion of the curtain adjacent to the bottom plate.

8. The server cabinet of claim 5, further comprising a rear side plate disposed at rear sides of the top and bottom plates and defining a plurality of through holes therein, the curtain assembly being disposed at a front side of the top plate.

9. The server cabinet of claim 8, wherein the through holes in the rear side plate have a same diameter.

10. A server system comprising:
    a server cabinet comprising:
       a top plate and a bottom plate opposite to the top plate;

a left side plate and a right side plate connecting with the top and bottom plates respectively; and a curtain assembly disposed at a top of a front side of the server cabinet, the curtain assembly comprising a pivot and a curtain connected to the pivot, the curtain defining a plurality of through holes therein, the curtain being capable of unrolling out from around the pivot toward the bottom plate to thereby selectively partially or completely cover the front side of the server cabinet;

a plurality of servers received in the server cabinet and stacked one on another; and an airflow generating device disposed at a top end of the server cabinet, wherein when the curtain is unrolled a portion of airflow generated by the airflow generating device is blocked by the curtain at the top end of the server cabinet and flows toward a lower region of the server cabinet.

11. The server system of claim 10, wherein a supporting portion extends from each of top ends of the left and right side plates, each supporting portion defining a circular pivot hole therein, two ends of the pivot respectively extending through the pivot holes of the supporting portions, the pivot being rotatable relative to the supporting portions, an area of the curtain covering the front side of the server cabinet being adjusted by rotating the pivot.

12. The server system of claim 10, wherein the curtain assembly further comprises a rod connected to a bottom end of the curtain.

13. The server system of claim 12, wherein one pair of opposite fixing portions extend from the front sides of the left and right side plates, each fixing portion defining a cutout therein, two ends of the rod being received in the cutouts of the fixing portions.

14. The server system of claim 10, wherein the through holes are arranged in a plurality of matrixes along a height direction of the front side plate, the through holes in each matrix having the same diameter, the through holes in different matrixes having different sizes of diameters.

15. The server system of claim 14, wherein the diameter of each through hole in an upper half portion of the curtain assembly adjacent to the top plate is smaller than the diameter of each through hole in a lower half portion of the curtain assembly adjacent to the bottom plate.

16. The server system of claim 14, wherein the diameters of the through holes gradually increase from an upper half portion of the curtain assembly adjacent to the top plate to a lower half portion of the curtain assembly adjacent to the bottom plate.

17. The server system of claim 14, wherein the server cabinet further comprises a rear side plate disposed at rear sides of the top and bottom plates, the rear side plate defining a plurality of through holes therein, the curtain assembly being disposed at a front side of the top plate.

18. The server system of claim 17, wherein the through holes in the rear side plate have a same diameter.

19. The server system of claim 17, wherein the rear side plate pivotedly connects one of the left and right side plates.

20. The server system of claim 10, wherein at least one fan for absorbing airflow is disposed in each of the servers.

* * * * *

UNITED STATES PATENT AND TRADEMARK OFFICE
CERTIFICATE OF CORRECTION

PATENT NO. : 8,373,988 B2  
APPLICATION NO. : 12/979376  
DATED : February 12, 2013  
INVENTOR(S) : Yao-Ting Chang Page 1 of 1

It is certified that error appears in the above-identified patent and that said Letters Patent is hereby corrected as shown below:

Title Page, below Item (65) insert:

-- (30)   Foreign Application Priority Data

Nov. 25 2010   (TW) ..........................99140680 --

Signed and Sealed this  
Thirty-first Day of December, 2013

Margaret A. Focarino  
*Commissioner for Patents of the United States Patent and Trademark Office*